(12) United States Patent
Sugiyama et al.

(10) Patent No.: US 12,278,463 B2
(45) Date of Patent: Apr. 15, 2025

(54) EXTERNAL RESONANT LASER MODULE

(71) Applicant: HAMAMATSU PHOTONICS K.K., Hamamatsu (JP)

(72) Inventors: Atsushi Sugiyama, Hamamatsu (JP); Takahide Ochiai, Hamamatsu (JP); Tadataka Edamura, Hamamatsu (JP); Naota Akikusa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 566 days.

(21) Appl. No.: 17/672,768

(22) Filed: Feb. 16, 2022

(65) Prior Publication Data

US 2022/0271506 A1    Aug. 25, 2022

(30) Foreign Application Priority Data

Feb. 24, 2021   (JP) ................................. 2021-027512

(51) Int. Cl.
| | |
|---|---|
| *H01S 5/14* | (2006.01) |
| *H01S 5/02325* | (2021.01) |
| *H01S 5/02345* | (2021.01) |
| *H01S 5/34* | (2006.01) |

(52) U.S. Cl.
CPC .......... *H01S 5/142* (2013.01); *H01S 5/02325* (2021.01); *H01S 5/02345* (2021.01); *H01S 5/3401* (2013.01); *H01S 5/3402* (2013.01)

(58) Field of Classification Search
CPC .. H01S 5/142; H01S 5/02325; H01S 5/02345; H01S 5/02326; H01S 5/141; H01S 5/02216; H01S 5/02218; H01S 5/02253; H01S 5/3401; H01S 3/1055
See application file for complete search history.

(56) References Cited

U.S. PATENT DOCUMENTS

| | | | |
|---|---|---|---|
| 2007/0047599 A1* | 3/2007 | Wysocki ................. | H01S 5/141 372/102 |
| 2008/0075133 A1* | 3/2008 | Day ......................... | H01S 5/14 372/36 |

(Continued)

FOREIGN PATENT DOCUMENTS

| | | |
|---|---|---|
| CN | 105242396 A | 1/2016 |
| JP | 2002-289960 A | 10/2002 |

(Continued)

*Primary Examiner* — Xinning(Tom) Niu
(74) *Attorney, Agent, or Firm* — Faegre Drinker Biddle & Reath LLP

(57) ABSTRACT

The laser module includes a QCL element, a MEMS diffraction grating, a lens holder holding a lens disposed between the QCL element and the MEMS diffraction grating, a package, an electrode terminal disposed along an inner wall surface of the package, and a wire for electrically connecting the electrode terminal and a coil. The top wall of the package faces the bottom wall of the package in a direction orthogonal to the optical axis direction of the lens. The MEMS diffraction grating includes an electrode pad electrically connected to the coil. The electrode pad is connected to the electrode terminal via the wire. A height position of the electrode pad with respect to the bottom wall is equal to or higher than a height position of the electrode terminal with respect to the bottom wall.

5 Claims, 8 Drawing Sheets

(56) References Cited

U.S. PATENT DOCUMENTS

| | | | |
|---|---|---|---|
| 2008/0159341 A1* | 7/2008 | Patel | H01S 5/141 |
| | | | 372/102 |
| 2009/0028197 A1 | 1/2009 | Arnone et al. | |
| 2009/0225802 A1 | 9/2009 | Day et al. | |
| 2010/0243891 A1* | 9/2010 | Day | G02B 6/4266 |
| | | | 372/45.01 |
| 2018/0062350 A1* | 3/2018 | Sugiyama | H01S 3/1055 |

FOREIGN PATENT DOCUMENTS

| | | |
|---|---|---|
| JP | 2007-515771 A | 6/2007 |
| JP | 2019-036577 A | 3/2019 |
| JP | 2019-152687 A | 9/2019 |
| WO | WO-2005/041371 A1 | 5/2005 |

* cited by examiner

EXTERNAL RESONANT LASER MODULE

TECHNICAL FIELD

The present disclosure relates to an external resonant laser module.

REFERENCE TO RELATED APPLICATION

This application claims the benefit of priority from Japanese Patent Application No. 2021-027512, filed Feb. 24, 2021, the entire contents of which are incorporated herein by reference.

BACKGROUND

An external resonant laser module including a quantum cascade laser element, a swingable diffraction grating, and a lens disposed between the quantum cascade laser element and the diffraction grating is known (see, for example, U.S. Patent Application Publication No. 2009/0225802). In the external resonant laser module, light from the quantum cascade laser element is diffracted and reflected by the diffraction grating, and light having a specific wavelength among the light from the quantum cascade laser element is returned to the quantum cascade laser element. Accordingly, an external resonator is configured by an end surface of the quantum cascade laser element and the diffraction grating, and the light of the specific wavelength is amplified and output to the outside. By oscillating the diffraction grating to change the wavelength of the output light, wavelength sweeping can be performed in a predetermined wavelength range.

SUMMARY

In the above-described external resonant laser module, it is necessary to pass a current through the coil for oscillating the diffraction grating. As an electrical connection configuration therefor, a configuration capable of securing stability (reliability) of the operation of the external resonant laser module and workability at the time of assembly is required.

Therefore, an object of one aspect of the present disclosure is to provide an external resonant laser module capable of improving reliability and workability during assembly.

According to an aspect of the present disclosure, an external resonant laser module includes: a quantum cascade laser element; a diffraction grating constituting an external resonator of the quantum cascade laser element and including a diffraction grating portion configured to diffract and reflect light emitted from the quantum cascade laser element, and a coil through which a current flows to oscillate the diffraction grating portion; a lens holder disposed between the quantum cascade laser element and the movable diffraction grating and holding a lens for passing an outgoing light from the quantum cascade laser element and a light returned from the movable diffraction grating to the quantum cascade laser element; a package for accommodating the quantum cascade laser element, the movable diffraction grating, and the lens holder; an electrode terminal disposed along an inner wall surface of the package; and a wire configured to electrically connect the electrode terminal and the coil. The package includes a bottom wall, a side wall erected on the bottom wall and formed in an annular shape so as to surround a region in which the quantum cascade laser element is accommodated when viewed from a direction perpendicular to the bottom wall, and a top wall closing an opening of the side wall on a side opposite to a side where the bottom wall is disposed. The top wall faces the bottom wall in a direction orthogonal to an optical axis direction along with an optical axis of the lens. The movable diffraction grating includes an electrode pad electrically connected to the coil. The electrode pad is connected to the electrode terminal via the wire. A height position of the electrode pad with respect to the bottom wall is equal to or higher than a height position of the electrode terminal with respect to the bottom wall.

In the external resonant laser module, the electrode pad of the movable diffraction grating is disposed at a height position equal to or higher than that of the electrode terminal disposed along the inner wall surface of the package in the package. By setting the position of the electrode pad in this manner, compared to a case in which the height position of the electrode pad is disposed at a position lower than the height position of the electrode terminal on the package side (that is, the bottom wall side of the package), the formation of the wire by wire bonding is facilitated, and the necessary wire length can be shortened. Since the wire length can be shortened, the wire can have appropriate tension, and interference between the wire and members in the package can be appropriately suppressed. As described above, the reliability of the external resonant laser module and the workability during assembly can be improved.

The movable diffraction grating may have a rectangular frame-shaped support portion that supports the diffraction grating portion. The electrode pad may be provided at one corner portion of the support portion on a side where the top wall is disposed. According to the above configuration, electrical connection is achieved at the corner of the support portion, which is a position relatively distant from the center of the diffraction grating portion. Accordingly, since it is possible to reduce the occurrence of stray light caused by the wire and the electrode pad, it is possible to effectively improve the reliability of the external resonant laser module.

The movable diffraction grating may further include a first electrode pad electrically connected to a first coil different from the coil. The first electrode pad may be provided at the other corner portion of the support portion on a side where the top wall is disposed. According to the above configuration, even in the case where two types of coils are provided in the movable diffraction grating, the electrode pads corresponding to the coils are provided at a pair of corners on the top wall side of the rectangular frame-shaped support portion (that is, the upper left corner and the upper right corner when the support portion is viewed from the front side with the top wall side facing upward), whereby the above-described effects (that is, the reliability of the external resonant laser module and the workability during assembly are improved) can be obtained.

The movable diffraction grating may constitute a diffraction grating unit together with a magnet that generates a magnetic field acting on the coil. The magnet may be disposed on a side opposite to a side where the quantum cascade laser element is provided with respect to the movable diffraction grating. According to the above configuration, it is possible to improve the degree of freedom of arrangement of the electrode pad.

According to an aspect of the present disclosure, it is possible to provide an external resonant laser module capable of improving reliability and workability during assembly.

DETAILED DESCRIPTION

Figure 1:
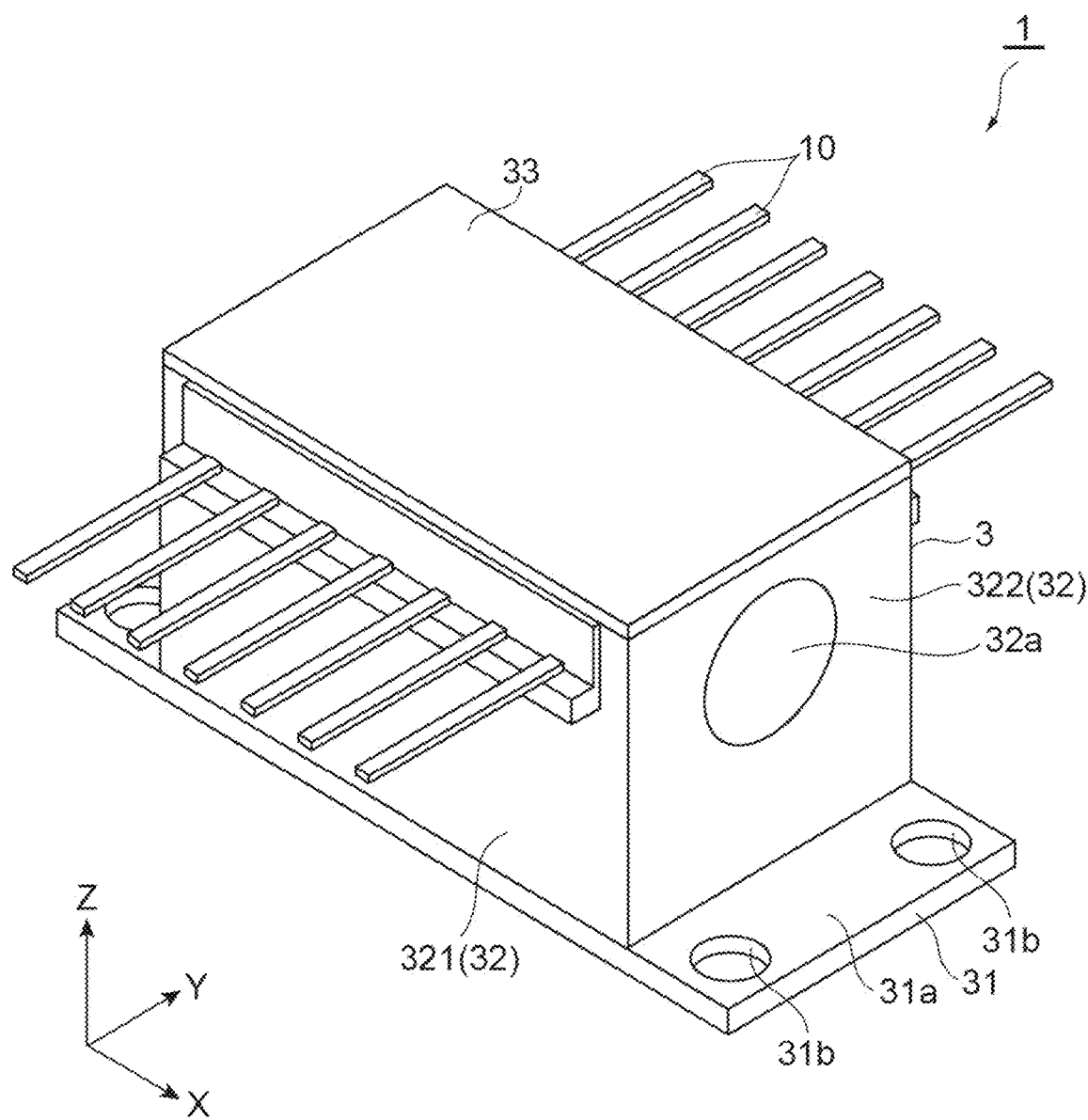
FIG. 1 is a perspective view of an external resonant laser module according to an embodiment.

Hereinafter, an embodiment of the present invention will be described in detail with reference to the drawings. In the following description, the same or corresponding elements are denoted by the same reference numerals, and redundant description will be omitted. Further, terms such as "upper" and "lower" are used for convenience based on the state shown in the drawings.

As shown in FIGS. 1 to 4, an external resonant laser module 1 (hereinafter referred to as a "laser module 1") includes a quantum cascade laser element (hereinafter referred to as a "QCL element") 2 and a package 3 that airtightly accommodates the QCL element 2. The laser module 1 is a wavelength-variable light source in which the wavelength of output light (laser light L) is variable. The laser module 1 can be used for, for example, biological measurement of glucose or the like, measurement of an absorption spectrum of an analysis target such as VOC gas (volatile organic compound) having a light absorption band. For example, when the absorption spectrum is measured, the analysis target accommodated in a light-transmissive container is disposed between the laser module 1 and a photodetector (not illustrated). The laser module 1 performs wavelength sweeping in a predetermined wavelength range (for example, a mid-infrared region) by changing the wavelength of the output light (laser light L) at high speed. Thus, the absorption spectrum is calculated based on the detection result of the photodetector. The analysis target may be any one of gas, liquid, and solid.

Figure 2:
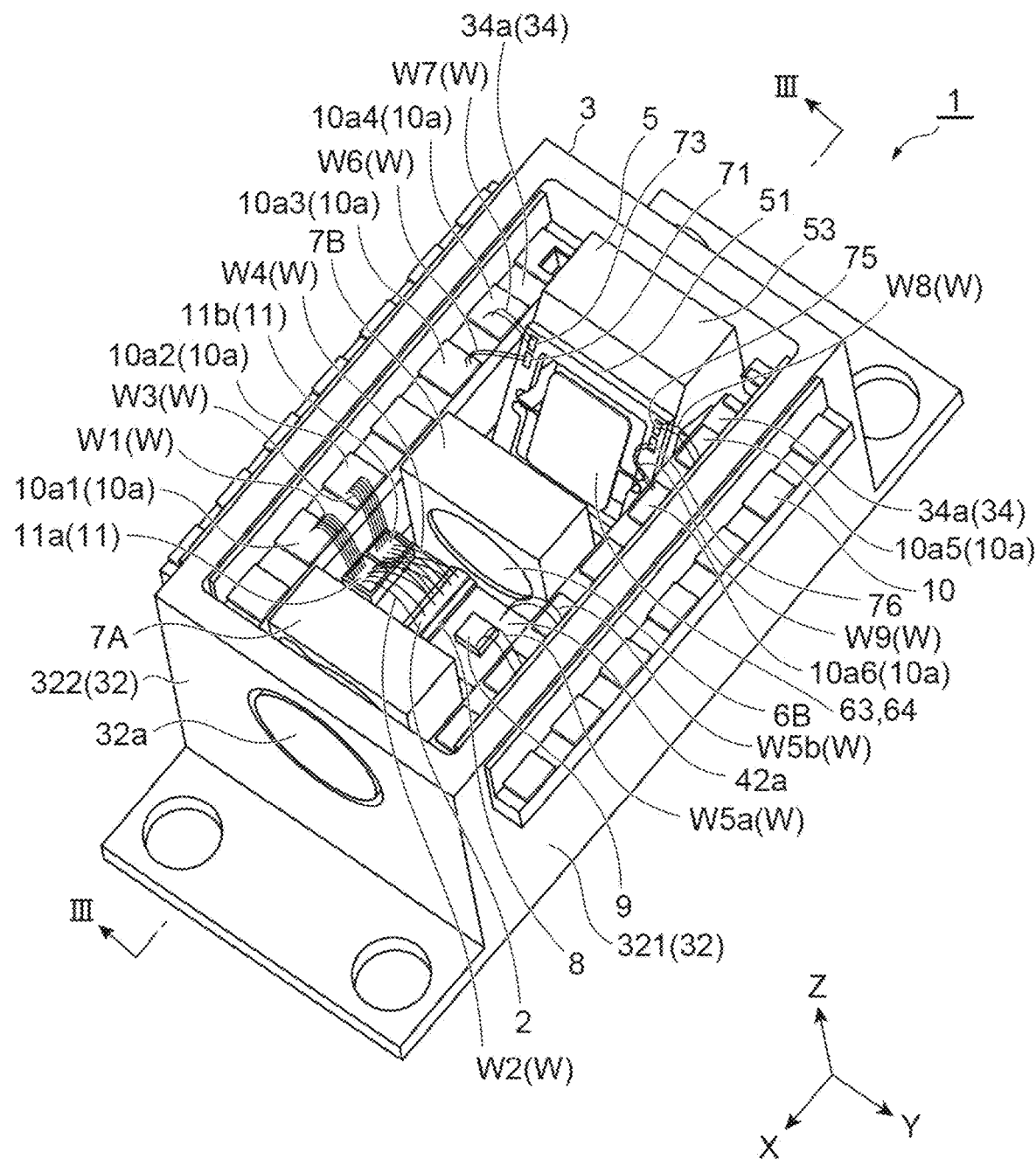
FIG. 2 is a perspective view showing an internal configuration of the external resonant laser module.

The package 3 is a housing that accommodates the QCL element 2, a mount member 4, a diffraction grating unit 5, a lens holder 7A (first lens holder) that holds a lens 6A (first lens), and a lens holder 7B (second lens holder) that holds a lens 6B (second lens). In the present embodiment, as an example, the package 3 is configured as a butterfly package. The package 3 has a bottom wall 31, a side wall 32, and a top wall 33. In FIG. 2, illustration of the top wall 33 of the package 3 is omitted, and illustration of a portion of a lead terminal 10 protruding outward from a protruding wall 34 is omitted.

The bottom wall 31 is a rectangular plate-shaped member. The bottom wall 31 is formed of a metal material such as copper tungsten. The bottom wall 31 is a base member on which the mount member 4 is mounted. In this specification, for the sake of convenience, the longitudinal direction of the bottom wall 31 is represented as an X-axis direction, the lateral direction of the bottom wall 31 is represented as a Y-axis direction, and a direction perpendicular to the bottom wall 31 (that is, a direction orthogonal to the X-axis direction and the Y-axis direction) is represented as a Z-axis direction. The X-axis direction corresponds to a direction along with an optical axis of the laser light L emitted from the QCL element 2 (optical axis direction).

The side wall 32 is erected on the bottom wall 31. The side wall 32 is formed in an annular shape so as to surround an internal space in which the QCL element 2 and the like are accommodated when viewed from the Z-axis direction. In the present embodiment, the side wall 32 is a rectangular tubular member. The side wall 32 is formed of a metal material such as Kovar. The side wall 32 is, for example, a Kovar frame plated with Ni/Au. In the present embodiment, the side wall 32 is provided at a central portion of the bottom wall 31 in the longitudinal direction (X-axis direction). The width of the side wall 32 in the lateral direction (the Y-axis direction) matches the width of the bottom wall 31 in the lateral direction, and the width of the side wall 32 in the longitudinal direction (the X-axis direction) is shorter than the width of the bottom wall 31 in the longitudinal direction. That is, protruding portions 31a are formed on both sides of the bottom wall 31 in the longitudinal direction so as to protrude outward from the side wall 32. Screw holes 31b for attaching the package 3 (bottom wall 31) to another member is provided in a portion corresponding to four corners of the bottom wall 31 in the protruding portion 31a.

The top wall 33 is a member that closes the opening of the side wall 32 on the side opposite to the bottom wall 31 side. The top wall 33 has a rectangular plate shape. The outer shape (width in the longitudinal direction and the lateral direction) of the top wall 33 viewed from the Z-axis direction substantially coincides with the outer shape of the side wall 32. The top wall 33 is formed of, for example, the same metal material (for example, kovar or the like) as that of the side wall 32. The top wall 33 is joined to an end portion of the side wall 32 opposite to the bottom wall 31 side by seam welding or the like, for example.

A plurality of lead terminals 10 (in the present embodiment, a total of 14 lead terminals, i.e., seven lead terminals on each side in the lateral direction) for passing current through members such as the QCL element 2 housed in the package 3 are inserted into a pair of first side walls 321 (i.e., portions intersecting the lateral direction (Y-axis direction)) extending along the longitudinal direction (X-axis direction) of the side walls 32. Each lead terminal 10 is a flat plate-shaped conductive member extending in the Y-axis direction.

Figure 4:
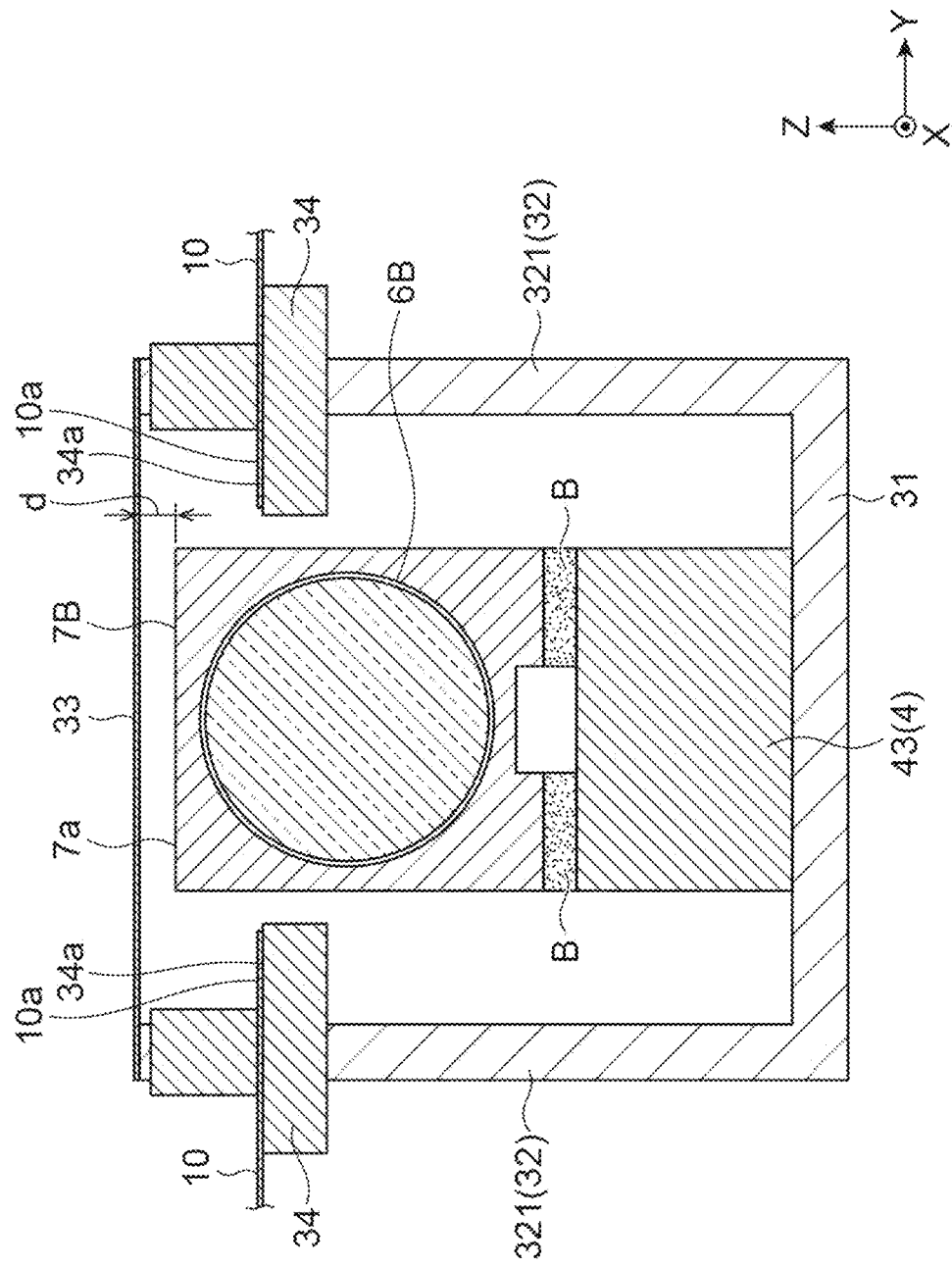
FIG. 4 is a cross-sectional view of the external resonant laser module taken along line IV-IV of FIG. 3.

In addition, each of the pair of first side walls 321 is provided with a protruding wall 34 that protrudes from both the outer surface (outer surface of the package 3) side and the inner surface (inner surface of the package 3) side of the first side wall 321 (see FIG. 4). The protruding wall 34 is an eaves-like member provided so as to extend along the X-axis direction above (on a side where the top wall 33 is disposed) the center position of the first side wall 321 in the Z-axis direction. The lead terminals 10 are disposed on a top surface 34a of the protruding wall 34 at substantially equal intervals along the X-axis direction. A portion of the lead terminal 10 along the inner wall surface (inner surface of the first side wall 321) of the package 3 (that is, a portion located inside the package 3) functions as an electrode terminal 10a for supplying power to each member (for example, the QCL element 2, a MEMS diffraction grating 51, a temperature sensor 9 described later, and the like) in the package 3. That is, the electrode terminal 10a and each member are electrically connected to each other via a conductive wire W, so that power is supplied from the external power source to each member.

A light exit window 32a through which the laser light L emitted from one end surface (first end surface 2a) of the QCL element 2 passes is provided on one of second side walls 322 (i.e., portions intersecting the longitudinal direction (X-axis direction)) extending along the lateral direction (Y-axis direction) of the side wall 32. The light exit window 32a is formed of, for example, a material (for example, germanium or the like) that transmits laser light L having wavelengths in a mid-infrared region. In the present embodiment, as an example, the light exit window 32a is formed in a disc shape. The light exit window 32a is fixed to a circular opening formed in one of the second side walls 322.

Figure 3:
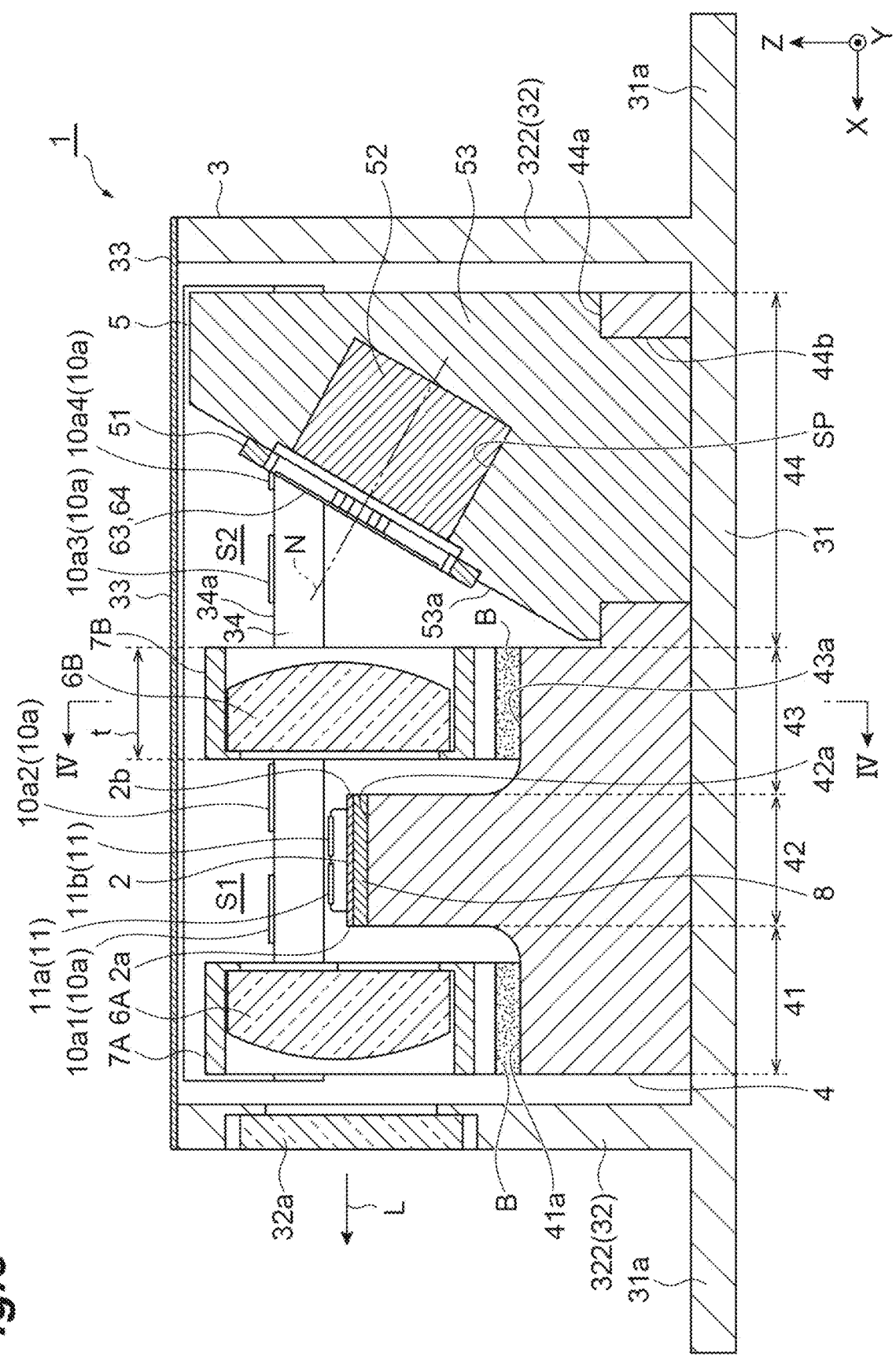
FIG. 3 is a cross-sectional view of the external resonant laser module taken along line III-III of FIG. 2.

Next, each member housed in the package 3 will be described. As illustrated in FIG. 3, the QCL element 2, the diffraction grating unit 5, and the lens holders 7A and 7B are disposed on the bottom wall 31 via the mount member 4. The mount member 4 is an optical stage on which the above-described optical element is mounted. In FIG. 3, the wire W is not shown. The mount member 4 is fixed to the bottom wall 31 by, for example, bonding or screwing. The mount member 4 is formed of a material having excellent thermal conductivity, such as copper. In the present embodiment, the mount member 4 is disposed directly on the bottom wall 31, but the mount member 4 may be disposed on the bottom wall 31 via a cooling element such as a Peltier module. In the present embodiment, the mount member 4 is a single member, but the mount member 4 may be a combination of a plurality of members (components).

Figure 5:
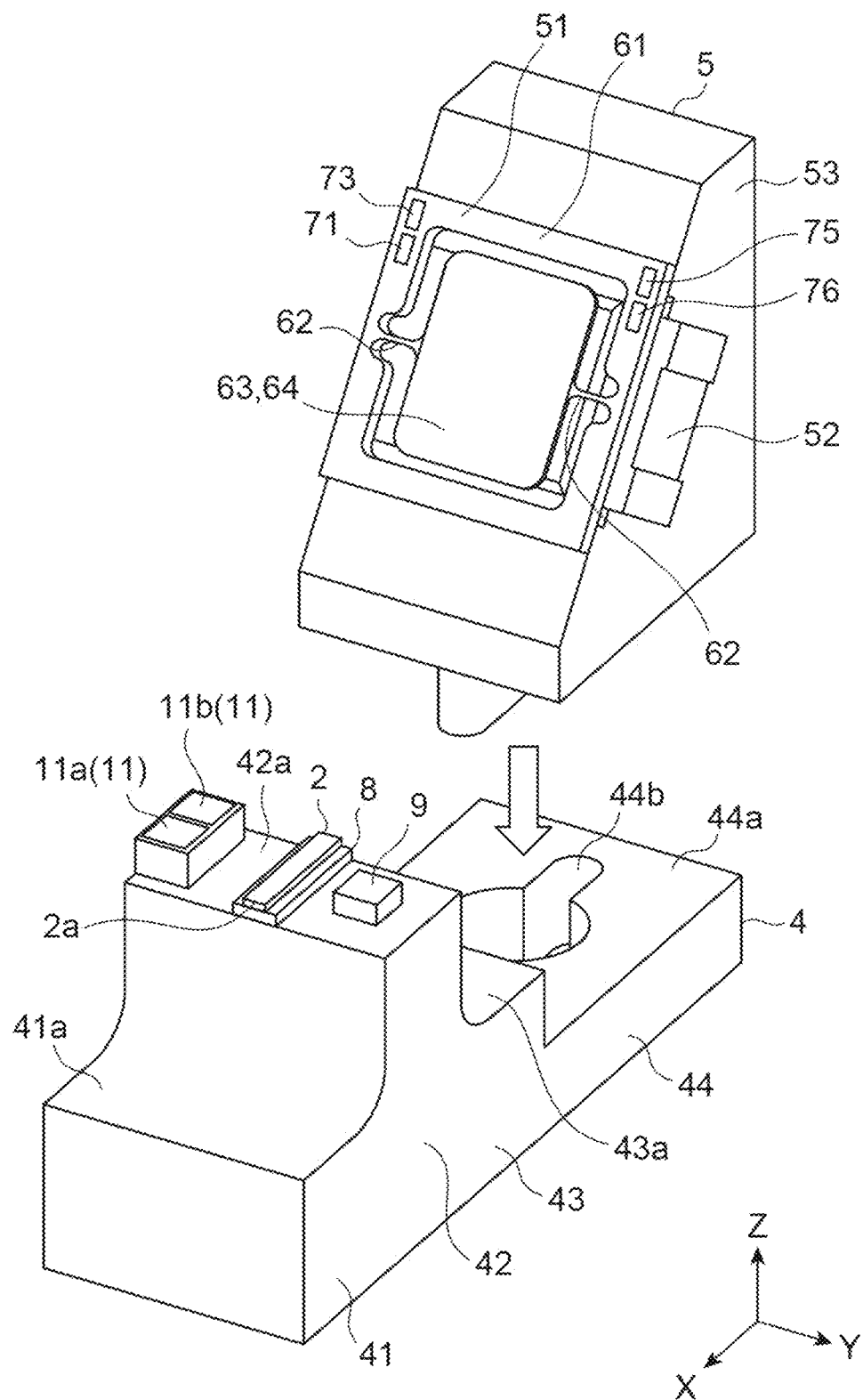
FIG. 5 is a diagram showing the relationship between a mount member and a diffraction grating unit.

As shown in FIGS. 3 and 5, the mount member 4 is a member elongated in the X-axis direction. The mount member 4 has a first mounting portion 41 on which the lens holder 7A is mounted, a second mounting portion 42 on which the QCL element 2 is mounted, a third mounting portion 43 on which the lens holder 7B is mounted, and a fourth mounting portion 44 on which the diffraction grating unit 5 is mounted, in order from the side closer to the light exit window 32a. That is, the light exit window 32a, the lens 6A (lens holder 7A), the QCL element 2, the lens 6B (lens holder 7B), and the diffraction grating unit 5 are disposed in this order along the X-axis direction.

The first mounting portion 41 and the third mounting portion 43 have the same thickness. That is, with respect to the bottom wall 31, the height position of the top surface 41a of the first mounting portion 41 coincides with the height position of the top surface 43a of the third mounting portion 43. The lens holder 7A is bonded and fixed to the top surface 41a of the first mounting portion 41 via a resin adhesive B (for example, photo-curable resins). Similarly, the lens holder 7B is bonded and fixed to the top surface 43a of the third mounting portion 43 via a resin adhesive B (for example, photo-curable resins).

The second mounting portion 42 is provided between the first mounting portion 41 and the third mounting portion 43. The second mounting portion 42 is thicker than the first mounting portion 41 and the third mounting portion 43, and protrudes with respect to the first mounting portion 41 and the third mounting portion 43. That is, the top surface 42a of the second mounting portion 42 is located at a position higher than the top surface 41a of the first mounting portion 41 and the top surface 43a of the third mounting portion 43. The QCL element 2 is fixed to the top surface 42a of the second mounting portion 42 via a submount 8. The submount 8 is a rectangular plate-shaped member on which the QCL element 2 is placed. The submount 8 is disposed at the center position of the top surface 42a in the Y-axis direction. The submount 8 is formed of a material (for example, aluminum nitride) having a thermal expansion coefficient close to that of the QCL element 2. The QCL element 2 is bonded to the submount 8 via, for example, an AuSn-based solder material. The submount 8 is bonded to the mount member 4 (top surface 42a) via, for example, an In-based (InSn, InAg, or the like) solder material. As described above, since the QCL element 2 is integrated with the submount 8, a combination of the QCL element 2 and the submount 8 may be regarded as a "QCL element".

In addition to the submount 8, a temperature sensor 9 and an electrode pad 11 are disposed on the top surface 42a of the second mounting portion 42. The temperature sensor 9 and the electrode pad 11 are bonded to the mount member 4 (top surface 42a) via, for example, resin adhesive or the like. In the present embodiment, the temperature sensor 9 and the electrode pad 11 are disposed on opposite sides of the submount 8. The temperature sensor 9 is, for example, a thermistor. The electrode pad 11 relays the electrical connection between the electrode terminal 10a and the QCL element 2. In the present embodiment, two electrode pads 11 are provided on the top surface 42a of the second mounting portion 42. More specifically, an electrode pad 11a electrically connected to a cathode of the QCL element 2 (the top surface (mesa top surface) of the QCL element 2 in the present embodiment) and an electrode pad 11b electrically connected to an anode of the QCL element 2 (the submount 8 in the present embodiment) are provided on the top surface 42a of the second mounting portion 42. Each of the electrode pads 11a and 11b has a substantially rectangular connection region (top surface). The electrode pads 11a and 11b are disposed along the X-axis direction. The electrode pad 11a is located closer to the light exit window 32a than the electrode pad 11b. The height positions of the electrode pads 11a and 11b with respect to the bottom wall 31 are lower than the height position of the electrode terminal 10a (that is, the height position of the top surface 34a of the protruding wall 34) and higher than the height position of the QCL element 2.

The fourth mounting portion 44 is thinner than the first mounting portion 41 and the third mounting portion 43. That is, the top surface 44a of the fourth mounting portion 44 is positioned lower than the top surface 41a of the first mounting portion 41 and the top surface 43a of the third mounting portion 43. A placement hole 44b is formed in the fourth mounting portion 44. As shown in FIG. 5, the diffraction grating unit 5 is fixed to the fourth mounting portion 44 using a resin adhesive or the like in a state in which a part of a yoke 53 described later is disposed in the placement hole 44b.

The QCL element 2 has a first end surface 2a and a second end surface 2a opposite to the first end surface 2b. The QCL element 2 emits light in a mid-infrared region (for example, 4 μm to 12 μm) from each of the first end surface 2a and the second end surface 2b. The first end surface 2a and the second end surface 2b are, for example, flat surfaces perpendicular to the X-axis direction, and the optical axes of the laser light L emitted from the QCL element 2 are along the X-axis direction. The QCL element 2 includes an active layer composed of a plurality of quantum well layers (for example, InGaAs) and a plurality of quantum barrier layers (for example, InAlAs), and a pair of clad layers (for example, InP) sandwiching the active layer, and can emit broadband light as described above. In the present embodiment, the stacking direction of the stacked structure including the active layer and the clad layers in the QCL element 2 coincides with the direction (Z-axis direction) in which the bottom wall 31 and the top wall 33 face each other. Note that the QCL element 2 may include a plurality of active layers having center wavelengths different from each other and a pair of clad layers. Even in this case, the QCL element 2 can emit broadband light as described above. The first end surface 2a is provided with a low reflection coating, and the second end surface 2b is provided with a non-reflection coating.

The lenses 6A and 6B are aspherical lenses made of, for example, ZnSe. Antireflection coating is applied to the surfaces of the lenses 6A and 6B.

The lens 6A is disposed on the opposite side of the QCL element 2 to the side where the MEMS diffraction grating 51 (diffraction grating unit 5) is located. In other words, the lens 6A is disposed at a position facing the first end surface 2a of the QCL element 2. The lens 6A passes the outgoing light from the QCL element 2 (the outgoing light from the first end surface 2a). The lens 6A collimates the light emitted from the first end surface 2a. The light collimated by the lens 6A passes through the light exit window 32a of the package 3 and is output to the outside as output light (laser light L).

The lens 6B is disposed between the QCL element 2 and the MEMS diffraction grating 51 (diffraction grating unit 5). That is, the lens 6B is disposed at a position facing the second end surface 2b of the QCL element 2. The lens 6B passes the outgoing light from the QCL element 2 (the outgoing light from the second end surface 2b) and light returned from the MEMS diffraction grating 51 to the QCL element 2. The lens 6B collimates the light emitted from the second end surface 2b to the MEMS diffraction grating 51.

Each of the lens holders 7A and 7B has a substantially rectangular parallelepiped outer shape. The lenses 6A and 6B are fixed to the lens holders 7A and 7B by resin adhesive or the like. The surfaces of the lens holders 7A and 7B are performed blacking process by, for example, alumite treatment or the like.

The diffraction grating unit 5 includes a MEMS diffraction grating 51 (movable diffraction grating), a magnet 52, and a yoke 53. The MEMS diffraction grating 51 is formed in a substantially plate shape. The magnet 52 is disposed on the opposite side of the QCL element 2 with respect to the MEMS diffraction grating 51. The MEMS diffraction grating 51 is fixed to the yoke 53, and the magnet 52 is housed in the yoke 53. As a result, the MEMS diffraction grating 51, the magnet 52, and the yoke 53 are integrated to form one unit.

The light collimated by the lens 6B enters the MEMS diffraction grating 51 of the diffraction grating unit 5. The MEMS diffraction grating 51 diffracts and reflects the incident light, thereby returning light of a specific wavelength in the incident light to the second end surface 2b of the QCL element 2 via the lens 6B. The MEMS diffraction grating 51 constitutes an external resonator for the QCL element 2. In this embodiment, the MEMS diffraction grating 51 and the first end surface 2a constitute a Littrow type external resonator. As a result, the laser module 1 can amplify the light of the specific wavelength and output the amplified light to the outside.

In the MEMS diffraction grating 51, the direction of a diffraction grating portion 64 that diffracts and reflects incident light can be changed at a high speed. As a result, the wavelengths of light returning from the MEMS diffraction grating 51 to the second end surface 2b of the QCL element 2 are variable, and thus the wavelengths of output light (laser light L) of the laser module 1 are variable. By changing the wavelengths of the laser light L, for example, it is possible to perform wavelength-sweeping within the range of the gain band of the QCL element 2.

Figure 6:
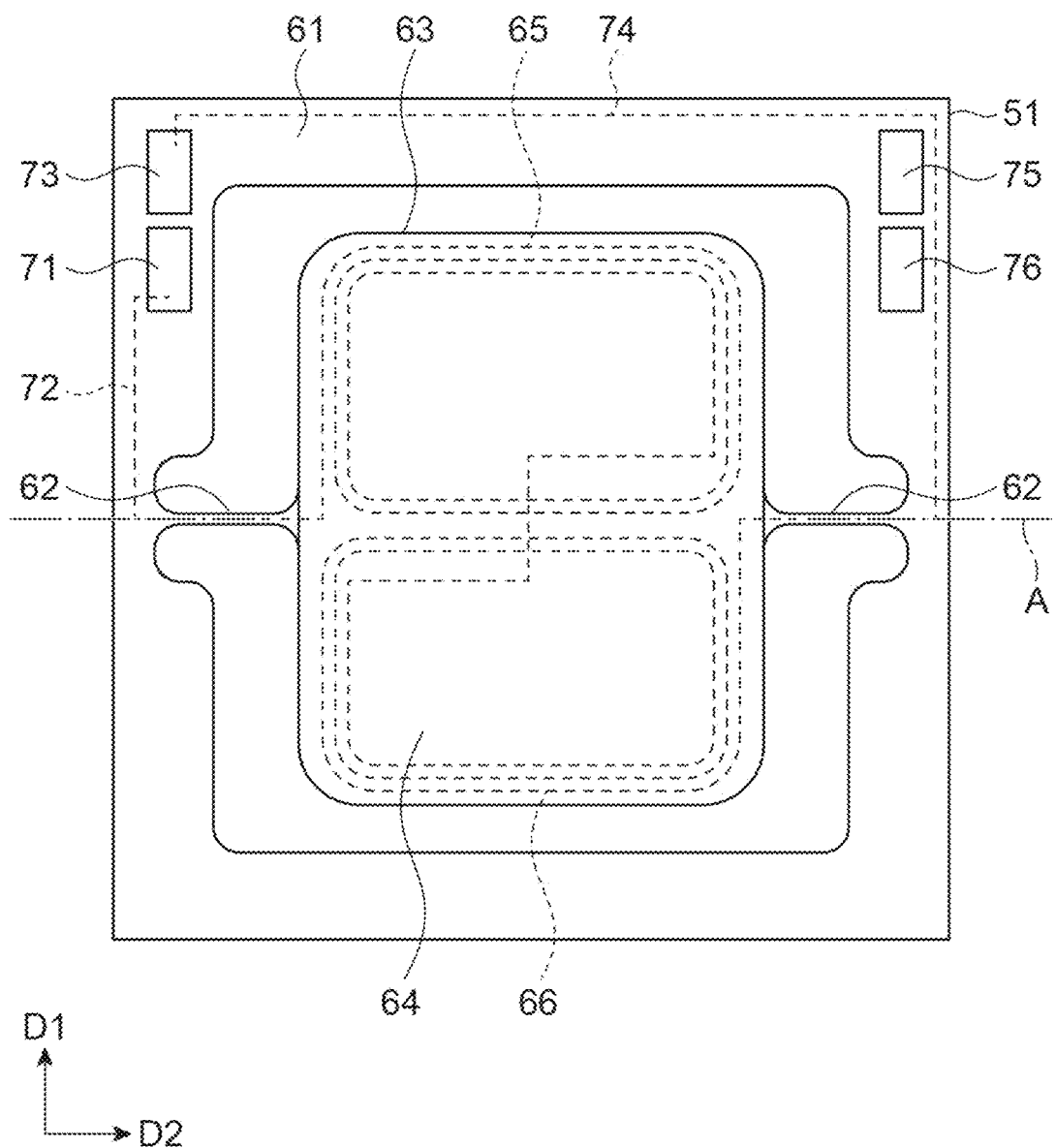
FIG. 6 is a front view of a MEMS diffraction grating.

As shown in FIG. 6, the MEMS diffraction grating 51 includes a support portion 61, a pair of connection parts 62, a movable portion 63, a diffraction grating portion 64, and a pair of coils 65 and 66. The MEMS diffraction grating 51 is configured as a MEMS device that oscillates the movable portion 63 about the axis A. The MEMS diffraction grating 51 is formed by processing a semiconductor substrate using MEMS technology (patterning, etching, or the like).

The support portion 61 is a flat plate-shaped frame body having a rectangular shape in plan view. The support portion 61 supports the movable portion 63 via the pair of the connection parts 62. Each connection part 62 is a flat plate-like member having a rectangular bar shape in a plan view, and extends straight along the axis A. Each connection part 62 connects the movable portion 63 to the support portion 61 on the axis A such that the movable portion 63 is swingable about the axis A.

The movable portion 63 is located inside the support portion 61. The movable portion 63 is swingable about the axis A as described above. The movable portion 63 is a flat plate-shaped member having a substantially rectangular shape in plan view. In the present embodiment, as an example, the four corners of the movable portion 63 are chamfered an R shape. That is, the four corners of the movable portion 63 are curved in an arc shape in a plan view. As a result, the moment of inertia of the movable portion 63 can be reduced, and the speed of swinging of the movable portion 63 can be increased. In this example, the movable portion 63 is formed in a substantially rectangular shape in which the long side of the movable portion 63 is parallel to the first direction D1 (direction orthogonal to the axis A), and a length of the movable portion 63 in the first direction D1 is longer than a length of the movable portion 63 in the second direction D2 (direction parallel to the axis A). As an example, a length of the support portion 61 in the first direction D1 is about 6 to 7 mm, and a length of the support portion 61 in the second direction D2 is about 6 mm. The length of the movable portion 63 in the first direction D1 is about 4 mm, the length of the movable portion 63 in the second direction D2 is about 3 mm, and the thickness of the movable portion 63 is about 30 μm. The support portion 61, the connection part 62, and the movable portion 63 are integrally formed by being built in one SOI (Silicon on Insulator) substrate, for example.

A diffraction grating portion 64 is provided on a surface of the movable portion 63 on a side where the QCL element 2 is disposed. The diffraction grating portion 64 has a plurality of grating grooves (not shown) and diffracts and reflects the light emitted from the QCL element 2. The diffraction grating portion 64 includes, for example, a resin layer which is provided on the surface of the movable portion 63 and formed with a diffraction grating pattern, and a metal layer which is provided over the surface of the resin layer along the diffraction grating pattern. Alternatively, the diffraction grating portion 64 may be formed of only a metal layer provided on the movable portion 63 and formed with a diffraction grating pattern. As the diffraction grating pattern, for example, a blazed grating with a saw-tooth cross section, a binary grating with a rectangular cross section, a holographic grating with a sinusoidal cross section, or the like can be used. The diffraction grating pattern is formed in the resin layer by, for example, nanoimprint lithography. The metal layer is, for example, a metal reflective film made of gold, and is formed by vapor deposition.

Each of the coils 65 and 66 is made of a metal material such as copper, and has a damascene structure embedded in a groove formed in the surface of the movable portion 63. In a plan view, the coil 65 is disposed on one side (upper side in FIG. 6) with respect to the axis A, and the coil 66 is disposed on the other side (lower side in FIG. 6) with respect to the axis A. Each of the coils 65 and 66 is a drive coil through which a current for driving the MEMS diffraction grating 51 (that is, for swinging the movable portion 63) flows.

Each of the coils 65 and 66 is spirally wound a plurality of times in plan view. An outer end of the coil 65 is electrically connected to an electrode pad 71 provided on the support portion 61 via a wiring 72. The wiring 72 extends over the support portion 61, the one connection part 62 and the movable portion 63. An outer end of the coil 66 is electrically connected to an electrode pad 73 provided on the support portion 61 via a wiring 74. The wiring 74 extends over the support portion 61, the other connection part 62 and the movable portion 63. In the present embodiment, a detecting coil (first coil) (not shown) is provided on the surface of the movable portion 63 together with the coils 65 and 66. Therefore, in addition to the electrode pads 71 and 73 electrically connected to the coils 65 and 66, the support portion 61 is provided with electrode pads 75 and 76 (first electrode pad) electrically connected to both end portions of the detection coil via wiring (not shown) (wiring similar to the wirings 72 and 74) in order to extract the current detected by the detection coil to the outside.

An inner end of the coil 65 is electrically connected to an inner end of the coil 66. In this example, since the coils 65 and 66 are formed integrally with each other, inner end portions of the coils 65 and 66 are electrically connected to each other. In other words, in the MEMS diffraction grating 51, one coil wiring (multilayer wiring) extends so as to be folded back in a figure eight shape in plan view, and thus a pair of coils 65 and 66 is configured. Note that the coils 65 and 66 may be formed separately from each other. In this case, the inner end portion of the coil 65 and the inner end portion of the coil 66 may be electrically connected to each other via wiring.

The magnet 52 generates a magnetic field (magnetic force) that acts on the coils 65 and 66. As shown in FIG. 3, the magnet 52 is a neodymium magnet (permanent magnet) formed in a substantially rectangular parallelepiped shape. For example, the magnet 52 has an N pole on a side where the MEMS diffraction grating 51 is disposed and an S pole on a side opposite to the MEMS diffraction grating 51.

The yoke 53 amplifies the magnetic force of the magnet 52 and forms a magnetic circuit together with the magnet 52. The surface of the yoke 53 is black-processed by, for example, zinc plating. As shown in FIG. 3, the yoke 53 has an inclined surface 53a. The inclined surface 53a is inclined with respect to the second end surface 2b of the QCL element 2. Since the MEMS diffraction grating 51 is fixed on the inclined surface 53a, the normal line N of the diffraction grating portion 64 of the MEMS diffraction grating 51 may be inclined with respect to the second end surface 2b. In this example, the diffraction grating portion 64 is inclined so as to face one side (top wall 33 side) in the Z-axis direction, but the diffraction grating portion 64 may be inclined so as to face the other side (bottom wall 31 side) in the Z-axis direction. The inclination angle of the inclined surface 53a (the angle with respect to the second end surface 2b of the QCL element 2) is set in accordance with the oscillation wave length of the QCL element 2, the number of grating grooves in the diffraction grating portion 64, the blazed angle, and the like. For example, when the oscillation wave length is a 7 μm band and the number of grooves is 150 grooves/mm, the inclination angle of the inclined surface 53a is set to about 60 degrees.

The yoke 53 is formed in a substantially U-shape (inverted C-shape) when viewed from the Y-axis direction, and defines an arrangement space SP opened in the inclined surface 53a. The magnet 52 is disposed in the arrangement space SP, and the magnet 52 is accommodated in the yoke 53. The yoke 53 surrounds the magnet 52 when viewed from the Y-axis direction. The MEMS diffraction grating 51 is fixed to the inclined surface 53a at the edge of the support portion 61 so as to cover the opening of the arrangement space SP.

In the MEMS diffraction grating 51, when a current flows through the coils 65 and 66, a Lorentz force is generated in a predetermined direction in electrons flowing in the coils 65 and 66 by a magnetic field formed by the magnet 52 and the yoke 53. As a result, the coil 65 receives a force in a predetermined direction. Therefore, the movable portion 63 (diffraction grating portion 64) can be swung around the axis A by controlling the direction or magnitude of the current flowing through the coil 65. In addition, the movable portion 63 can be swung at high speed at the resonance-frequency level (for example, at frequencies equal to or higher than 1 kHz) by causing a current having frequencies corresponding to the resonance frequencies of the movable portion 63 to flow through the coils 65 and 66. In this manner, the coils 65 and 66, the magnet 52, and the yoke 53 function as an actuator unit that swings the movable portion 63.

Figure 7:
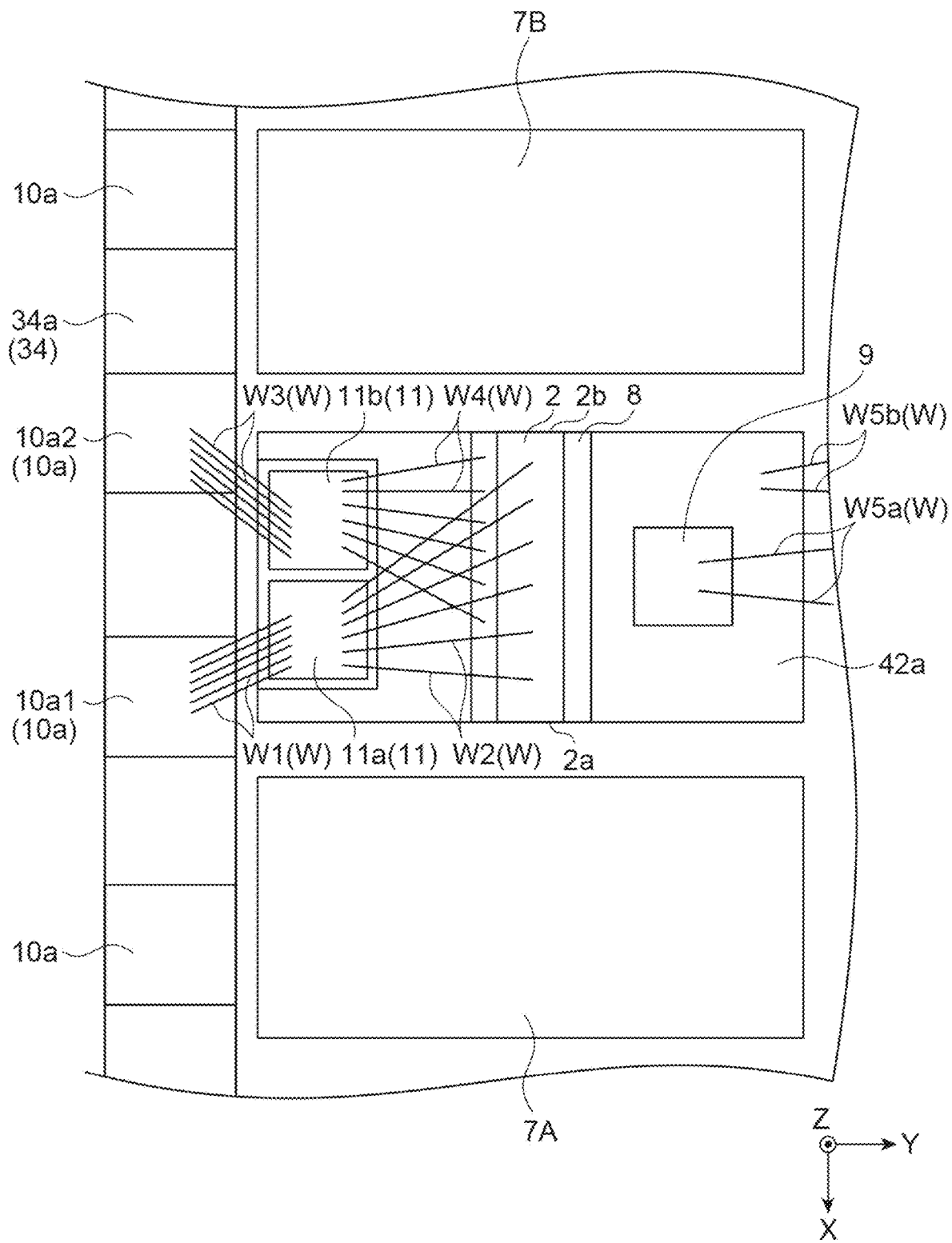
FIG. 7 is a diagram illustrating an electrical connection configuration between a quantum cascade laser element and an electrode terminal.

Next, an electrical connection configuration between the QCL element 2 and the electrode terminal 10a will be described with reference to FIGS. 2 and 7. As illustrated in FIGS. 2 and 7, the electrode terminal 10a and the QCL element 2 (in the present embodiment, each of the cathode and the anode of the QCL element 2) are electrically connected to each other via a wire W. The wire W is formed by wire bonding, for example. An end portion of the wire W on the QCL element 2 side (i.e., a side where the QCL element 2 is disposed) is disposed at a position between the lens holder 7A and the lens holder 7B when viewed from a direction (in the present embodiment, a direction parallel to a plane orthogonal to the X-axis direction, for example, the Y-axis direction and the Z-axis direction) orthogonal to a facing direction (in the present embodiment, the X-axis direction) in which the lens holder 7A and the lens holder 7B face each other. In the present embodiment, as an example, the end portion of the wire W on the QCL element 2 side is connected to the QCL element 2 or the submount 8. The wire W is connected to the electrode terminal 10a at a position between the lens holder 7A and the lens holder 7B when viewed from the direction orthogonal to the facing direction. In other words, the wire W is connected to the electrode terminal 10a at a position that does not overlap the lens holder 7A or the lens holder 7B when viewed from a direction orthogonal to the facing direction. In the present embodiment, the two electrode terminals 10a1 and 10a2 are provided at positions that do not overlap the lens holder 7A or the lens holder 7B when viewed from a direction orthogonal to the facing direction. By using the two electrode terminals 10a1 and 10a2, the above-described arrangement configuration is realized. The electrode terminals 10a1 and 10a2 are the second and third electrode terminals 10a counted from the light exit window 32a side in the protruding wall 34 on a side where the electrode pad 11 is provided with respect to the QCL element 2.

The electrode terminal 10a1 is electrically connected to the cathode of the QCL element 2 (in the present embodiment, the top surface of the QCL element 2). The electrode terminal 10a1 is connected to the top surface of the QCL element 2 via the electrode pad 11a. More specifically, the electrode terminal 10a1 is connected to the electrode pad 11a via a plurality of (six in the present embodiment) wires W1 (first wires). The electrode pad 11a is connected to the top surface of the QCL element 2 via a plurality of (six in the present embodiment) wires W2 (second wires). The number of each of the wires W1 and W2 may be one, but by using a plurality of wires W1 and a plurality of wires W2, it is possible to reliably achieve electrical connection between the electrode terminal 10a1 and the cathode of the QCL element 2 (the top surface of the QCL element 2). Further, as shown in FIG. 7, by disposing a plurality of wires W2 substantially uniformly along the optical axis direction (X-axis direction) on the top surface (mesa top surface) of the QCL element 2, the amount of current injected into the QCL element 2 can be made substantially uniform along the optical axis direction, so that the operation of the QCL element 2 can be stabilized.

The electrode terminal 10a2 is electrically connected to the anode (submount 8 in the present embodiment) of the QCL element 2. The electrode terminal 10a2 is connected to the submount 8 via the electrode pad 11b. More specifically, the electrode terminal 10a2 is connected to the electrode pad 11b via a plurality of (six in the present embodiment) wires W3 (first wires). The electrode pad 11b is connected to the submount 8 via a plurality of (six in the present embodiment) wires W4 (second wires). The number of each of the wires W3 and W4 may be one, but by using a plurality of wires W3 and W4, it is possible to reliably achieve electrical connection between the electrode terminal 10a2 and the anode (submount 8) of the QCL element 2.

As described above, the laser module 1 is configured such that the entirety of the wire W (wires W1 to W4) for electrically connecting the electrode terminal 10a and the QCL element 2 (anode or cathode) passes through the space between the lens holder 7A and the lens holder 7B when viewed from the direction (Y-axis direction, Z-axis direction, or the like) orthogonal to the facing direction (X-axis direction).

In the present embodiment, the temperature sensor 9 is also electrically connected to the electrode terminal 10a via a wire W5. More specifically, the wire W5 includes a wire W5a connected to the temperature sensor 9 and a wire W5b connected to the mount member 4. The wires W5a and W5b are connected to the electrode terminal 10a located at the second and third positions counted from the light exit window 32a side in the protruding wall 34 on a side where the temperature sensor 9 is provided with respect to the QCL element 2 (that is, the electrode terminal 10a disposed at a position not overlapping the lens holder 7A or the lens holder 7B when viewed from the direction orthogonal to the facing direction). Accordingly, the wires W5a and W5b electrically connecting the temperature sensor 9 and the electrode terminal 10a are also configured to pass through the space between the lens holder 7A and the lens holder 7B when viewed from the direction (the Y-axis direction, the Z-axis direction, or the like) orthogonal to the facing direction (the X-axis direction).

Next, an electrical connection configuration between the electrode terminal 10a and the MEMS diffraction grating 51 will be described with reference to FIG. 2. As described above, the MEMS diffraction grating 51 has two electrode pads 71 and 73 electrically connected to the coils 65 and 66. More specifically, as shown in FIGS. 2 and 6, each of the electrode pads 71 and 73 is provided at one corner of the support portion 61 on the top wall 33 side (i.e., a side where the top wall 33 is disposed) (the upper left corner when the MEMS diffraction grating 51 is viewed from the front). Each of the electrode pads 71 and 73 is connected to a corresponding electrode terminal 10a (electrode terminal 10a3 or 10a4) via a corresponding wire W (wire W6 or W7). The electrode terminals 10a3 and 10a4 are the third and second electrode terminals 10a counted from a side opposite to a side where the light exit window 32a is provided in the protruding wall 34 on the side where the electrode pad 11 is provided with respect to the QCL element 2.

The electrode terminal 10a3 is connected to the electrode pad 71 via a plurality of (two in the present embodiment) wires W6. The electrode terminal 10a4 is connected to the electrode pad 73 via a plurality of (two in the present embodiment) wires W7. The number of each of the wires W6 and W7 may be one, but by using a plurality of wires W6 and a plurality of wires W7, it is possible to reliably achieve electrical connection between each of the electrode terminals 10a3 and 10a4 and each of the electrode pads 71 and 73.

The height positions of the electrode pads 71 and 73 with respect to the bottom wall 31 is equal to or higher than the height positions of the electrode terminals 10a3 and 10a4 with respect to the bottom wall 31. That is, the electrode pads 71 and 73 does not enter the deep side (i.e., a side where the bottom wall 31 is disposed) of the package 3 with respect to the corresponding electrode terminals 10a3 and 10a4. Therefore, when the wires W6 and W7 are connected by wire bonding, it is not necessary to insert capillaries of a wire bonding apparatus into the deep side of the package 3. Accordingly, it is possible to appropriately suppress contact of the capillaries with another member (for example, a lens holder 7B or the like) in the package 3 and breakage of the member due to the contact.

In the present embodiment, the electrode pads 75 and 76 provided on the opposite side of the electrode pads 71 and 73 in the Y-axis direction also have the same electrical connection configuration as the electrode pads 71 and 73. That is, the electrode pads 75 and 76 are provided at the other corner of the support portion 61 on the top wall 33 side (the upper right corner when the MEMS diffraction grating 51 is viewed from the front). Each of the electrode pads 75 and 76 is connected to a corresponding electrode terminal 10a (electrode terminal 10a5 or 10a6) via a corresponding wire W (wire W8 or W9). The electrode terminals 10a5 and 10a6 are the second and third electrode terminals 10a counted from a side opposite to the side where the light exit window 32a is provided in the protruding wall 34 on the side where the temperature sensor 9 is provided with respect to the QCL element 2. The height positions of the electrode pads 75 and 76 with respect to the bottom wall 31 is equal to or higher than the height positions of the electrode terminals 10a5 and 10a6 with respect to the bottom wall 31. The electrode terminal 10a5 is connected to the electrode pad 75 via a plurality of (two in the present embodiment) wires W8. The electrode terminal 10a6 is connected to the electrode pad 76 via a plurality of (two in the present embodiment) wires W8. The number of each of the wires W8 and W9 may be one, but by using a plurality of wires W8 and a plurality of wires W9, it is possible to reliably achieve electrical connection between each of the electrode terminals 10a5 and 10a6 and each of the electrode pads 75 and 76.

Next, the arrangement configuration of the lens holder 7B will be described with reference to FIGS. 3 and 4. The distance d (see FIG. 4) between the top wall 33 and the surface 7a on the top wall side (i.e., surface on a side where the top wall 33 is disposed) of the lens holder 7B is smaller than a thickness t (see FIG. 3) of the lens holder 7B along the optical axis direction (X-axis direction) of the lens 6B. The distance d is, for example, about 0.64 mm. The thickness t is, for example, about 2.5 mm. In addition, the surface 7a of the lens holder 7B is located at a position higher than the electrode terminals 10a1 and the 10a2 to which the wires W1 and W3 are connected (a position closer to the top wall 33).

Next, a method of manufacturing the laser module 1 will be described. First, the QCL element 2 and the MEMS diffraction grating 51 (diffraction grating unit 5) are disposed in the package 3 (first step). In the present embodiment, the following processing is executed. The QCL element 2 is solder-bonded to the submount 8 with, for example, an AuSn-based solder material. Subsequently, the submount 8 on which the QCL element 2 is mounted is bonded to the top surface 42a of the second mounting portion 42 of the mount member 4 with, for example, an AuSn-based solder material. The temperature sensor 9 and the electrode pad 11 are bonded to the top surface 42a of the mount member 4 via, for example, resin adhesive or the like. In addition, the previously assembled diffraction grating unit 5 is fixed to the fourth mounting portion 44 using a resin adhesive or the like in a state in which a portion of the yoke 53 is disposed in the placement hole 44b of the fourth mounting portion 44 of the mount member 4. As a result, the mount member 4 becomes a state in which the respective members other than the lens holders 7A and 7B are mounted. The first step is completed by fixing the mount member 4 in such a state on the bottom wall 31 of the package 3 in a state where the top wall 33 is not attached. The mount member 4 may be first fixed on the bottom wall 31 in a state in which the above-described members are not mounted. In this case, each of the above-described members is mounted on the mount member 4 fixed to the bottom wall 31 through the opening of the side wall 32 on the top wall 33 side.

Subsequently, wire bonding is performed to form wires W1 to W4 that electrically connect the QCL element 2 (anode and cathode) disposed in the package 3 to the electrode terminals 10a1 and 10a2 (second step). In the present embodiment, since the QCL element 2 and the electrode terminals 10a1 and 10a2 are electrically connected to each other via the electrode pads 11a and 11b, the following processing is performed as an example. First, by wire bonding, a plurality of (six in the present embodiment) wires W2 are formed from the top surface of the QCL element 2 (cathode of the QCL element 2) to the electrode pad 11a, and a plurality of (six in the present embodiment) wires W4 are formed from the submount 8 (anode of the QCL element 2) to the electrode pad 11b. Subsequently, a plurality of (six in the present embodiment) wires W1 are formed from the electrode pad 11a to the electrode terminal 10a1, and a plurality of (six in the present embodiment) wires W3 are formed from the electrode pad 11b to the electrode terminal 10a2. Here, the end portion of the wire W on the QCL element 2 side (in the present embodiment, the end portion connected to the top surface of the QCL element 2 in the wire W2 and the end portion connected to the submount 8 in the wire W4) is disposed between the position where the lens holder 7A is to be disposed and the position where the lens holder 7B is to be disposed when viewed from the direction orthogonal to the X-axis direction (the Y-axis direction, the Z-axis direction, and the like). In addition, the wires W1 and W3 and the electrode terminals 10a1 and 10a2 are connected to each other at a position between a position where the lens holder 7A is to be disposed and a position where the lens holder 7B is to be disposed when viewed from a direction (the Y-axis direction, the Z-axis direction, or the like) orthogonal to the X-axis direction.

Figure 8:
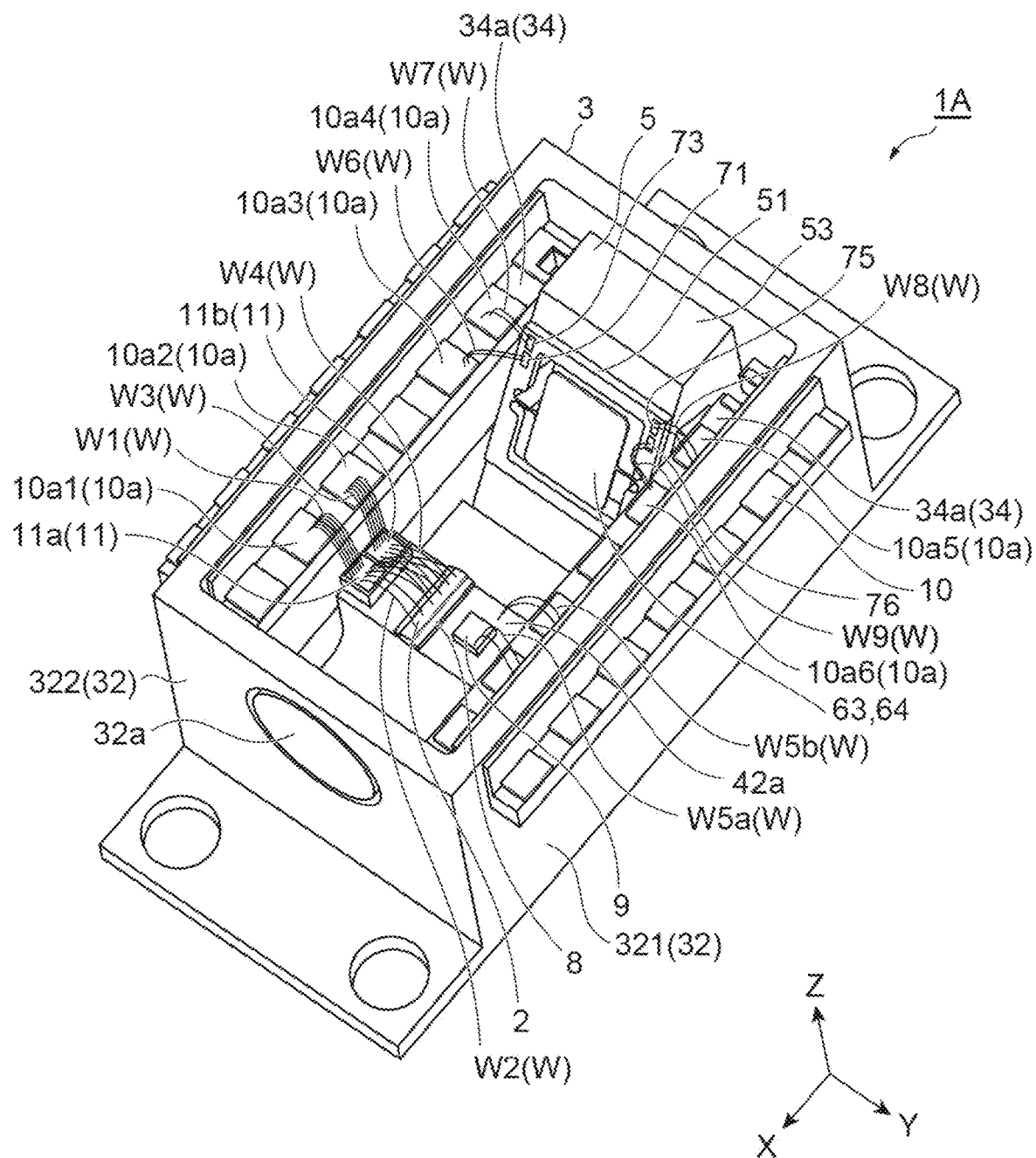
FIG. 8 is a diagram showing a manufacturing process of the external resonant laser module.

In the second step, the wires W5a and the W5b that electrically connect the temperature sensor 9 and the electrode terminal 10a are also formed by wire bonding. Further, the wires W6 to W9 electrically connecting the electrode pads 71, 73, 75, and 76 of the MEMS diffraction grating 51 and the electrode terminals 10a3 to 10a6 are also formed by wire bonding. As described above, the height position of each electrode pad 71, 73, 75, and 76 is equal to or higher than the height positions of the electrode terminals 10a3 to 10a6. Accordingly, compared to a case where the height position of each electrode pad 71, 73, 75, and 76 is lower than the height positions of the electrode terminals 10a3 to 10a6 (that is, a case where each electrode pad 71, 73, 75, and 76 is positioned on the deep side (bottom wall 31 side) of the package 3), the workability of wire bonding to each electrode pad 71, 73, 75, and 76 is significantly improved. By performing the second step, as illustrated in FIG. 8, an intermediate 1A in a state in which members other than the lens holders 7A and 7B are disposed in the package 3 before the top wall 33 is attached is obtained.

Subsequently, the lens holder 7A in which the lens 6A is held and the lens holder 7B in which the lens 6B is held are disposed in the package 3 (third step). In the present embodiment, the lens holder 7A is bonded to the top surface 41a of the first mounting portion 41 of the mount member 4 via the resin adhesive B. In addition, the lens holder 7B is bonded to the top surface 43a of the third mounting portion 43 of the mount member 4 via the resin adhesive B.

In the third step, the lens holders 7A and 7B are fixed in the package 3 by aligning the lenses 6A and 6B in a state in which a driving voltage is applied to the QCL element 2 through the electrode terminals 10a1 and 10a2 and the wires W1 to W4 to cause laser oscillation. That is, positioning of the lens holders 7A and 7B is performed so that the optical axes of the lenses 6A and 6B coincide with the optical axes of the outgoing light of the QCL element 2 in a state where laser oscillation is performed.

After completion of the third step, the top wall 33 is joined to the upper end portion of the side wall 32 by seam welding or the like, whereby the laser module 1 shown in FIG. 1 is obtained.

[Effects]

In the laser module 1 described above, the lens holders 7A and 7B are disposed on both sides of the QCL element 2. In addition, the electrode terminal 10a disposed along the inner wall surface of the package 3 is electrically connected to the QCL element 2 (in the present embodiment, both the anode and the cathode of the QCL element 2) through a wire W. Here, the end portion of the wire W on the QCL element 2 side is disposed at a position between the lens holder 7A and the lens holder 7B when viewed from a direction (for example, the Y-axis direction and the Z-axis direction) orthogonal to the facing direction (the X-axis direction) in which the lens holder 7A and the lens holder 7B face each other. As a result, as shown in FIG. 7, it is possible to realize a configuration in which at least a portion of the wire W (a portion including the end portion on the QCL element 2 side) is disposed in the space between the lens holder 7A and the lens holder 7B from the electrode terminal 10a to the QCL element 2 (in the present embodiment, each of the top surface of the QCL element 2 as the cathode and the submount 8 as the anode). As a result, it is possible to suitably suppress interference between the wire W for supplying power to the QCL element 2 and the members in the package 3 (in particular, the lens holders 7A and 7B disposed on both sides of the QCL element 2). As described above, the reliability of the laser module 1 and the workability during assembly can be improved.

The wire W is connected to the electrode terminal 10a at a position between the lens holder 7A and the lens holder 7B when viewed from the direction (for example, the Y-axis direction, the Z-axis direction, or the like) orthogonal to the facing direction (the X-axis direction). Accordingly, it is possible to realize a configuration in which the entire wire W is disposed in the space between the lens holder 7A and the lens holder 7B from the electrode terminal 10a to the QCL element 2 (in the embodiment, each of the top surface of the QCL element 2 as the cathode and the submount 8 as the anode). Accordingly, it is possible to more suitably suppress interference between the wire W and the members (in particular, the lens holders 7A and 7B) in the package 3.

The height position of the electrode terminal 10a with respect to the bottom wall 31 is higher than the height position of the QCL element 2 with respect to the bottom wall 31. According to the above configuration, it is easy to connect the wire W having a moderate tension from the QCL element 2 to the electrode terminal 10a. As a result, the slack of the wire W can be suitably suppressed, and the interference between the wire W and the members in the package 3 can be more suitably suppressed. In the present embodiment, the QCL element 2 and the electrode terminal 10a are connected by two wires (a combination of wires W1 and W2 or a combination of wires W3 and W4) by relaying the electrode pad 11. The above-described effect can be obtained by disposing the electrode pad 11 at an intermediate height position between the QCL element 2 and the electrode terminal 10a as described later. In addition, in a case where the QCL element 2 and the electrode terminal 10a are directly connected to each other by one wire without relaying the electrode pad 11, the above-described effect is naturally obtained.

In the present embodiment, the wire W includes a wire W1 connecting the electrode terminal 10a1 and the electrode pad 11a, and a wire W2 connecting the electrode pad 11a and the QCL element (the top surface of the QCL element 2 serving as the cathode). Similarly, the wire W includes a wire W3 connecting the electrode terminal 10a2 and the electrode pad 11b, and a wire W4 connecting the electrode pad 11b and the QCL element (submount 8 as an anode). According to the above configuration, the lengths of the respective wires W1 to W4 can be shortened as compared with a case where the electrode terminals 10a1 and 10a2 and the QCL element (the top surface of the QCL element 2 or submount 8) are directly wire-connected. Accordingly, it is possible to suitably suppress loosening of the wires W1 to W4 and suitably suppress the interference between the wires W1 to W4 and the members in the package 3.

The electrode pads 11a and 11b are provided at positions between the lens holder 7A and the lens holder 7B when viewed from the direction (for example, the Y-axis direction, the Z-axis direction, and the like) orthogonal to the facing direction (the X-axis direction). According to the above-described configuration, it is possible to realize a configuration in which the entirety of the wires W1 to W4 passes through the space between the lens holder 7A and the lens holder 7B, and it is possible to shorten the lengths of the wires W1 to W4 by shortening the paths from the electrode terminals 10a1 and 10a2 to the QCL element (the top surface of the QCL element 2 or the submount 8) via the electrode pads 11a and 11b. Accordingly, it is possible to suitably suppress interference between the wires W1 to W4 and the members in the package 3.

The height positions of the electrode pads 11a and 11b with respect to the bottom wall 31 are lower than the height positions of the electrode terminals 10a1 and 10a2 with respect to the bottom wall 31, and are higher than the height position of the QCL element 2 with respect to the bottom wall 31. According to the above configuration, the height positions of the electrode terminals 10a1 and 10a2 on the package 3 side, the electrode pads 11a and 11b, and the QCL element 2 are set so as to be lowered in a stepwise manner. As a result, it is easy to connect the wires W2 and W4 having an appropriate tension from the QCL element 2 to the electrode pads 11a and 11b, and it is easy to connect the wires W1 and W3 having an appropriate tension from the electrode pads 11a and 11b to the electrode terminals 10a1 and 10a2. As a result, it is possible to suitably suppress loosening of the wires W1 to W4 and suitably suppress interference between the wires W1 to W4 and the members in the package 3.

In the manufacturing method (first step to third step), in the second step, the end portion of the wire W on the QCL element 2 side is disposed at a position between the lens holder 7A and the lens holder 7B when viewed from the direction (for example, the Y-axis direction and the Z-axis direction) orthogonal to the facing direction (X-axis direction) in which the lens holder 7A and the lens holder 7B face each other. Accordingly, it is possible to realize a configuration in which at least a portion of the wire W (a portion including an end portion on the QCL element 2 side) is disposed in a space between the lens holder 7A and the lens holder 7B from the electrode terminals 10a1 and 10a2 to the QCL element 2 (in the embodiment, each of the top surface of the QCL element 2 as a cathode and the submount 8 as an anode). As a result, when the lens holders 7A and 7B are disposed in the third step, it is possible to suitably suppress interference between the wire W and the lens holders 7A and 7B. As described above, the reliability of the laser module 1 and the workability during assembly can be improved.

In the third step, the lens holders 7A and 7B are fixed in the package 3 by aligning the lenses 6A and 6B in a state where a driving voltage is applied to the QCL element 2 through the electrode terminals 10a1 and 10a2 and the wire W to cause laser oscillation. According to the manufacturing method described above, the lens holders 7A and 7B can be appropriately positioned in the package 3 by performing alignment in a state in which laser oscillation is performed in the third step. Further, since the wire bonding is performed so that the wire W and the lens holders 7A and 7B do not interfere with each other in the second step, it is possible to easily perform alignment (that is, adjustment of the positions of the lens holders 7A and 7B) in the third step.

In the laser module 1, the distance d (see FIG. 4) between the top wall 33 and the surface 7a on the top wall 33 side of the lens holder 7B is smaller than the thickness t (see FIG. 3) of the lens holder 7B along the optical axis direction (X-axis direction) of the lens 6B. That is, in the package 3, the lens holder 7B is disposed such that the distance d (gap) between the top wall 33 and the lens holder 7B is smaller than the thickness t of the lens holder 7B. As a result, even if stray light that deviates from the lens 6B and travels toward the top wall 33 side among the light reflected by the MEMS diffraction grating 51 enters between the top wall 33 and the lens holder 7B, the stray light does not easily pass through the space between the top wall 33 and the lens holder 7B. That is, it is possible to effectively suppress entry of the stray light from the space S2 (see FIG. 3) on a side where the MEMS diffraction grating 51 is disposed with respect to the lens holder 7B to the space S1 (see FIG. 3) on a side where the QCL element 2 is disposed with respect to the lens holder 7B. As described above, it is possible to suppress the stray light component from being mixed into the laser light L emitted from the QCL element 2 to the outside and to appropriately secure the laser quality.

Note that the top wall 33 and the surface 7a of the lens holder 7B are preferably disposed so as to face each other. More preferably, the top wall 33 and the surface 7a of the lens holder 7B are disposed to face each other in parallel. Further, as shown in FIG. 4, it is preferable that the outer shape of the lens 6B in the YZ plane is circular and the outer shape of the lens holder 7B is rectangular. The thickness t of the lens holder 7B is the total height of the lens holder 7B in the X-axis direction. When the outer shape of the lens holder 7B is a rectangular parallelepiped shape, the thickness t of the lens holder 7B is a length of the surface 7a of the lens holder 7B along the X-axis direction. In addition, it is preferable that the thickness t of the lens holder 7B is equal to or greater than a thickness of the lens 6B along the optical axis direction (X-axis direction) from the viewpoint of stabilizing the lens 6B. In addition, the distance d is preferably equal to or less than the thickness of the lens 6B.

In addition, there may be a case where the top wall 33 and the surface 7a are not parallel to each other when viewed from the X-axis direction (for example, the surface 7a is inclined with respect to the top wall 33 when viewed from the X-axis direction), and the distance between the top wall 33 and the surface 7a at each position along the Y-axis direction varies. In this case, a statistical value (for example, a minimum, a maximum, or a mean value) of the distance (distance along the Z-axis direction) between the top wall 33 and the surface 7a at each position along the Y-axis direction may be set as the distance d between the top wall 33 and the surface 7a of the lens holder 7B described above.

In addition, there may be a case where the top wall 33 and the surface 7a are not parallel to each other when viewed from the Y-axis direction (for example, the surface 7a is inclined with respect to the top wall 33 when viewed from the Y-axis direction), and the distance between the top wall 33 and the surface 7a at each position along the X-axis direction varies. In this case, a statistical value (for example, a minimum, a maximum, value, or the like) of the distance between the top wall 33 and the surface 7a at each position along the X-axis direction may be set as the distance d between the top wall 33 and the surface 7a of the lens holder 7B described above.

If the top wall 33 and the surface 7a are not parallel to each other when viewed from both the X-axis direction and the Y-axis direction, a statistical value (for example, a minimum, a maximum, or a mean value) of the distance between each position of the surface 7a in the XY plane and the top wall 33 may be used as the distance d between the top wall 33 and the surface 7a of the lens holder 7B. In addition, it is preferable that a relationship similar to the relationship between the top wall 33 and the lens holder 7B described above is established between the top wall 33 and the lens holder 7A.

The wire W (wires W1 and W3) is connected to the electrode terminals 10a1 and 10a2 in a region on the side where the QCL element 2 is disposed with respect to the lens holder 7B when viewed from the direction (for example, the Y-axis direction, the Z-axis direction, or the like) orthogonal to the optical axis direction (the X-axis direction). The electrode terminals 10a1 and 10a2 are disposed at positions closer to the top wall 33 than the QCL element 2. The surface 7a on the top wall 33 side of the lens holder 7B is at a position closer to the top wall 33 than the electrode terminals 10a1 and 10a2. According to the above configuration, the electrode terminals 10a1 and 10a2 and the wire W (in the present embodiment, the wires W1 and W3) are connected in the space closer to the QCL element 2 than the lens holder 7B when viewed from the direction (for example, the Y-axis direction and the Z-axis direction) orthogonal to the optical axis direction (X-axis direction). Thus, the surface 7a of the lens holder 7B on the top wall 33 side can be closer to the top wall 33 than the electrode terminals 10a1 and 10a2 while suppressing interference between the wire W and the lens holder 7B. Accordingly, the lens holder 7B may be disposed such that the distance d between the top wall 33 and the lens holder 7B is as small as possible. As a result, it is possible to more effectively suppress the stray light generated in the space S2 from passing between the top wall 33 and the lens holder 7B and entering the space S1.

The stacking direction of the stacked structure including the active layer and the clad layer in the QCL element 2 coincides with the direction (Z-axis direction) in which the bottom wall 31 and the top wall 33 face each other. In the above-described configuration, the beam shape of light emitted from the end surfaces (first end surface 2a and second end surface 2b) of the QCL element 2 is an elliptical shape having a major axis along the stacking direction (Z-axis direction). In this case, since light emitted from the end surface of the QCL element 2 is likely to spread in the vertical direction (Z-axis direction), stray light reflected by the MEMS diffraction grating 51 and directed toward the top wall 33 is likely to be generated. On the other hand, the stray light is prevented from entering the space S1 by the positional relationship between the top wall 33 and the lens holder 7B (the relationship between the distance d and the thickness t). That is, by setting the positional relationship between the top wall 33 and the lens holder 7B described above, it is possible to dispose the QCL element 2 such that the stacking direction of the QCL element 2 coincides with the Z-axis direction while suitably suppressing a decrease in laser quality due to the stray light.

The blacking processing is performed on the surface of the lens holder 7B. In the present embodiment, the surface of the lens holder 7B is blackened by alumite treatment or the like. According to the above configuration, since a part of the stray light reflected by the MEMS diffraction grating 51 and deviated from the lens 6B is absorbed by the surface of the lens holder 7B processed to be black, it is possible to more effectively suppress the stray light from entering the space S1. In the present embodiment, in order to enhance the effect of reducing stray light, the surface of the yoke 53 is also processed to be black by zinc plating or the like.

Further, the height position of the electrode pads 71 and 73 of the MEMS diffraction grating 51 with respect to the bottom wall 31 is equal to or higher than the height positions of the electrode terminals 10a3 and 10a4 with respect to the bottom wall 31 (see FIGS. 2 and 3). That is, in the laser module 1, the electrode pads 71 and 73 of the MEMS diffraction grating 51 is disposed at a height position equal to or higher than the that of the electrode terminals 10a3 and 10a4 disposed along the side wall 32 (first side wall 321) of the package 3 in the package 3. In the present embodiment, of the two electrode pads 71 and 73, the electrode pad 73 on the upper side (top wall 33 side) is disposed at a position slightly higher than the height position of the electrode terminals 10a3 and 10a4, and the electrode pad 71 on the lower side (bottom wall 31 side) is disposed at a position substantially the same as the height position of the electrode terminals 10a3 and 10a4. By setting the position of the electrode pads 71 and 73 in this manner, compared to a case where the height positions of the electrode pads 71 and 73 are disposed at a position lower than the height positions of the electrode terminals 10a3 and 10a4 on the package 3 side (that is, on the deep side (bottom wall 31 side) of the package 3), the formation of the wires W6 and W7 by wire bonding is facilitated and the necessary wire length can be shortened. Since the wire length can be shortened, the wires W6 and the W7 can have appropriate tension, and interference between the wires W6 and W7 and the members (for example, each member included in the diffraction grating unit 5) in the package 3 can be appropriately suppressed. As described above, the reliability of the laser module 1 and the workability during assembly can be improved.

In addition, even when the MEMS diffraction grating 51 in which the ratio of the width of the optical surface (movable portions 63) to the width (width in the Y-axis direction) of the accommodation space of the package 3 is relatively large is adopted, it is possible to easily perform the wire bonding between the electrode terminals 10a3 and 10a4 and the electrode pads 71 and 73. As a result, the distance between the lens 6B and the MEMS diffraction grating 51 can be increased as compared with the case where the MEMS diffraction grating 51 having a relatively small ratio of the width of the optical surface is adopted, so that the difficulty of assembly can be greatly reduced. Hereinafter, the above will be described in detail. In the present embodiment, in order to suppress interference between the movable portion 63 and the wires W6 to W9, the electrode pads 71, 73, 75, and 76 are disposed on both sides of the movable portion 63 in the support portion 61. In such a configuration, when the width of the movable portion 63 is increased, the electrode pads 71, 73, 75, and 76 are disposed at a position close to the first side wall 321 in the Y-axis direction. In such a case, if the height positions of the electrode pads 71, 73, 75, and 76 are disposed at a deep position on the deep side of the package 3, it becomes difficult to perform wire bonding. That is, in the wire bonding, it is very difficult to allow the capillary to access the electrode pads 71, 73, 75, and 76. On the other hand, by disposing the electrode pads 71, 73, 75, and 76 at a height position equal to or higher than the electrode terminal 10a on the package 3 side as in the present embodiment, there is an advantage that wire bonding can be easily performed. In particular, when the width of the movable portion 63 is increased, the above-described advantage is significant. Further, the lens 6B is not necessarily capable of perfectly collimating the light emitted from the second end surface 2b of the QCL element 2 to the movable portion 63. Therefore, the light transmitted through the lens 6B may have a slight divergence angle. Therefore, when the movable portion 63 is narrow, it is necessary to bring the MEMS diffraction grating 51 as close as possible to the lens 6B. On the other hand, in the present embodiment, as described above, since the MEMS diffraction grating 51 having the movable portion 63 as wide as possible can be adopted, the distance between the lens 6B and the MEMS diffraction grating 51 can be increased. In addition, by using the MEMS diffraction grating 51 which is as large as possible with respect to the accommodation space in the package 3 (that is, the MEMS diffraction grating 51 in which the width of the movable portion 63 is made as close as possible to the lateral width (width along the Y-axis direction) of the package 3), it is possible to reduce the loss of light which is fed back to the QCL element 2 and to increase the output of the laser module 1.

The MEMS diffraction grating 51 has a rectangular frame-shaped support portion 61 that supports the diffraction grating portion 64, and the electrode pads 71 and 73 are provided at one corner of the support portion 61 on the top wall 33 side. In the present embodiment, the electrode pads 71 and 73 are provided at the upper left corner (see FIG. 6) when the MEMS diffraction grating 51 is viewed from the front. According to the above configuration, electrical connection is achieved at the corner portion of the support portion 61, which is a position relatively distant from the center of the diffraction grating portion 64. Accordingly, it is possible to reduce the occurrence of stray light caused by the wires W6 and W7 and the electrode pads 71 and 73, and thus it is possible to effectively improve the reliability of the laser module 1. Hereinafter, the above will be described in detail. Normally, the movable portion 63 is made as large as possible so that the diffraction grating portion 64 can receive the entire light beam emitted from the second end surface 2b of the QCL element 2. However, when a high current is injected into the QCL element 2, the spread angle of the beam light from the QCL element 2 increases, and the diffraction grating portion 64 does not necessarily receive the entire beam light (entire light flux). In such a case, the light that has passed through the gap between the movable portion 63 (diffraction grating portion 64) and the support portion 61 is irregularly reflected by the surface of the magnet 52 disposed on the back surface side of the movable portion 63, and may strike the electrode pads 71 and 73, the wire W, and the like to cause stray light. As described above, by disposing the electrode pads 71 and 73 at the corner portion of the support portion 61 which is a position relatively distant from the center of the diffraction grating portion 64, it is possible to suppress the irregularly reflected light from hitting the electrode pad 71 and 73, the wire W, and the like. As a result, the occurrence of the stray light described above can be effectively reduced.

The MEMS diffraction grating 51 further includes an electrode pads 75 and 76 (first electrode pad) electrically connected to a coil (detection coil, first coil, not shown) different from the coils 65 and 66 (drive coil). The electrode pads 75 and 76 are provided at the other corner portion of the support portion 61 on the top wall 33 side (that is, the corner portion on a side opposite to the side where the electrode pads 71 and 73 are provided). According to the above configuration, even when the MEMS diffraction grating 51 is provided with two types of coils (the driving coils 65 and 66 and the detecting coil in the present embodiment), the electrode pads 71, 73, 75, and 76 corresponding to the coils are provided at a pair of corners on the top wall 33 side of the rectangular frame-shaped support portion 61 (i.e., the upper left corner and the upper right corner when the support portion 61 is viewed from the front side with the top wall 33 side facing upward), whereby the above-described effects (that is, the reliability of the laser module 1 and the workability during assembly are improved) can be obtained.

The MEMS diffraction grating 51 constitutes a diffraction grating unit 5 together with the magnet 52 for generating a magnetic field acting on the coils 65 and 66. The magnet 52 is disposed on a side opposite to a side where the QCL element 2 is provided with respect to the MEMS diffraction grating 51. According to the above-described configuration, the degree of freedom of arrangement of the electrode pads 71, 73, 75, and 76 can be improved. More specifically, by providing the magnet 52 on the back surface side of the MEMS diffraction grating 51, it is not necessary to worry about interference between the magnet 52 and the electrode pads 71, 73, 75, and 76 (and the wire W connected to the electrode pads 71, 73, 75, and 76), and the electrode pads 71, 73, 75, and 76 can be freely disposed on the surface (surface facing the QCL element 2) of the support portion 61.

[Modifications]

Although one embodiment of the present disclosure has been described above, the present disclosure is not limited to the above embodiment. The material and shape of each component are not limited to those described above, and various materials and shapes may be employed. Further, a part of the configuration included in the laser module 1 according to the above-described embodiment may be omitted or changed as appropriate. For example, the electrode pad 11 may be omitted. In this case, the electrode terminal 10a and the QCL element (each of the top surface of the QCL element 2 and the submount 8) may be directly connected by one wire. In addition, when the detection coil is omitted in the MEMS diffraction grating 51, the electrode pads 75 and 76 may be omitted.

What is claimed is:

1. An external resonant laser module comprising:
   a quantum cascade laser element;
   a movable diffraction grating constituting an external resonator of the quantum cascade laser element, including:
       a diffraction grating portion configured to diffract and reflect light emitted from the quantum cascade laser element; and
       a coil through which a current flows to oscillate the diffraction grating portion;
   a lens holder disposed between the quantum cascade laser element and the movable diffraction grating and configured to hold a lens for passing an outgoing light from the quantum cascade laser element and a light returned from the movable diffraction grating to the quantum cascade laser element;
   a package configured to accommodate the quantum cascade laser element, the movable diffraction grating, and the lens holder;
   an electrode terminal disposed along an inner wall surface of the package; and
   a wire configured to electrically connect the electrode terminal and the coil,
   wherein the package includes:
       a bottom wall;
       a side wall erected on the bottom wall and formed in an annular shape so as to surround a region in which the quantum cascade laser element is accommodated when viewed from a direction perpendicular to the bottom wall; and
       a top wall closing an opening of the side wall on a side opposite to a side where the bottom wall is disposed,
   wherein the top wall faces the bottom wall in a direction orthogonal to an optical axis direction along with an optical axis of the lens,
   wherein the movable diffraction grating includes an electrode pad electrically connected to the coil,
   wherein the electrode pad is connected to the electrode terminal via the wire, and
   wherein a height position of the electrode pad with respect to the bottom wall is equal to or higher than a height position of the electrode terminal with respect to the bottom wall.

2. The external resonant laser module according to claim 1,
   wherein the movable diffraction grating has a rectangular frame-shaped support portion that supports the diffraction grating portion, and
   wherein the electrode pad is provided at one corner portion of the support portion on a side where the top wall is disposed.

3. The external resonant laser module according to claim 2,
   wherein the movable diffraction grating further includes a first electrode pad electrically connected to a first coil different from the coil, and
   wherein the first electrode pad is provided at the other corner portion of the support portion on a side where the top wall is disposed.

4. The external resonant laser module according to claim 2,
   wherein the movable diffraction grating constitutes a diffraction grating unit together with a magnet that generates a magnetic field acting on the coil, and
   wherein the magnet is disposed on a side opposite to a side where the quantum cascade laser element is provided with respect to the movable diffraction grating.

5. The external resonant laser module according to claim 1, wherein the electrode terminal is disposed more on a top wall side than on a central position between the top wall and the bottom wall in a height direction where the top wall and the bottom wall face each other.

* * * * *